(12) United States Patent
Nozoe

(10) Patent No.: US 7,375,538 B2
(45) Date of Patent: May 20, 2008

(54) METHOD OF INSPECTING PATTERN AND INSPECTING INSTRUMENT

(75) Inventor: Mari Nozoe, Hino (JP)

(73) Assignee: Hitachi, Ltd., Tokyo (JP)

( * ) Notice: Subject to any disclaimer, the term of this patent is extended or adjusted under 35 U.S.C. 154(b) by 170 days.

(21) Appl. No.: 11/166,231

(22) Filed: Jun. 27, 2005

(65) Prior Publication Data

US 2005/0250224 A1 Nov. 10, 2005

Related U.S. Application Data

(63) Continuation of application No. 10/395,197, filed on Mar. 25, 2003, now Pat. No. 6,924,482, which is a continuation of application No. 09/881,000, filed on Jun. 15, 2001, now Pat. No. 6,586,952.

(30) Foreign Application Priority Data

Jun. 19, 2000 (JP) ............................. 2000-187517

(51) Int. Cl.
*G01R 31/305* (2006.01)

(52) U.S. Cl. .................................... 324/751
(58) Field of Classification Search ................ 324/750, 324/751, 765, 158.1, 500–501; 250/310, 250/311, 309, 206; 356/394
See application file for complete search history.

(56) References Cited

U.S. PATENT DOCUMENTS

| | | | |
|---|---|---|---|
| 4,575,630 A | 3/1986 | Lukianoff | |
| 4,829,243 A | 5/1989 | Woodard et al. | |
| 4,870,344 A | 9/1989 | Stille | |
| 4,980,639 A | 12/1990 | Yoshizawa et al. | |
| 5,097,204 A | 3/1992 | Yoshizawa et al. | |
| 5,432,345 A | 7/1995 | Kelly | |
| 5,502,306 A * | 3/1996 | Meisburger et al. | ........ 250/310 |
| 5,777,327 A | 7/1998 | Mizuno | |
| 6,172,363 B1 | 1/2001 | Shinada et al. | |
| 6,245,311 B1 | 6/2001 | Kobayashi et al. | |
| 6,329,826 B1 * | 12/2001 | Shinada et al. | ............. 324/751 |

(Continued)

FOREIGN PATENT DOCUMENTS

JP 6-326165 11/1994

(Continued)

*Primary Examiner*—Ha Tran Nguyen
*Assistant Examiner*—Tung X. Nguyen
(74) *Attorney, Agent, or Firm*—Mattingly, Stanger, Malur & Brundidge

(57) ABSTRACT

Electron beam is irradiated to a wafer in the midst of steps at predetermined intervals by a plurality of times under a condition in which a junction becomes rearward bias and a difference in characteristic of a time period of alleviating charge in the rearward bias is monitored. As a result, charge is alleviated at a location where junction leakage is caused in a time period shorter than that of a normal portion and therefore, a potential difference is produced between the normal portion and a failed portion and is observed in a potential contrast image as a difference in brightness. By consecutively repeating operation of acquiring the image, executing an image processing in real time and storing a position and brightness of the failed portion, the automatic inspection of a designated region can be executed. Information of image, brightness and distribution of the failed portion is preserved and outputted automatically after inspection.

6 Claims, 10 Drawing Sheets

| U.S. PATENT DOCUMENTS | | | FOREIGN PATENT DOCUMENTS | | |
|---|---|---|---|---|---|
| 6,344,750 B1 | 2/2002 | Lo et al. | JP | 11-8278 | 1/1999 |
| 6,359,451 B1 | 3/2002 | Wallmark | JP | 11-121561 | 4/1999 |
| 6,465,781 B1 | 10/2002 | Nishimura et al. | | | |
| 6,586,952 B2 | 7/2003 | Nozoe et al. | | | |
| 6,753,524 B2 * | 6/2004 | Matsui et al. ............... 250/310 | * cited by examiner | | |

FIG.6
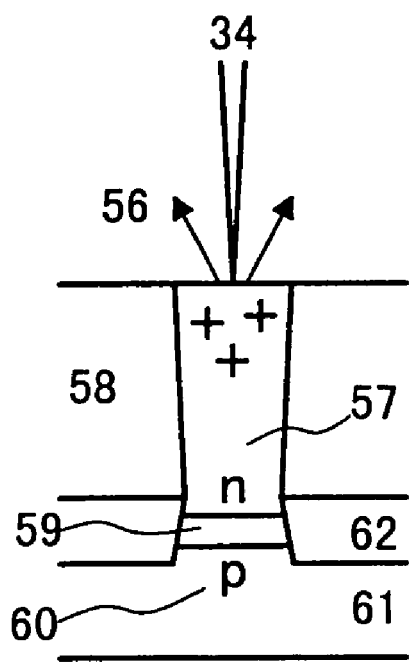
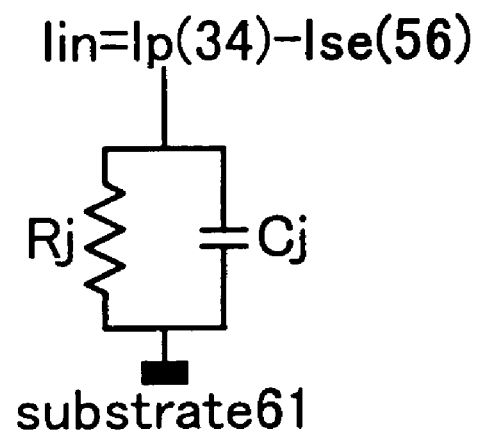

beam control parameter
- irradiation position
  (scanning position)(X0,Y0)
- irradiation area
  (scanning area)(X,Y)
- scan speed 10ns/pixel ~ 1 $\mu$s/pixel
- beam irradiation interval $10^{-7}$s ~ 10s
- irradiation time (1~20)

METHOD OF INSPECTING PATTERN AND INSPECTING INSTRUMENT

The above-referenced patent application is a continuation application of U.S. Ser. No. 10/395,197, filed Mar. 25, 2003, now U.S. Pat. No. 6,924,482, which is a continuation of U.S. Ser. No. 09/881,000, filed Jun. 15, 2001, now U.S. Pat. No. 6,586,952, from which priority is claimed under 35 U.S.C. §120.

BACKGROUND OF THE INVENTION

The present invention relates to a method and an apparatus of fabricating a substrate having a fine circuit pattern such as semiconductor device or liquid crystal, particularly to a technology of inspecting a semiconductor device and relates to a technology of evaluating electric properties by a wafer in the midst of a procedure of fabricating a semiconductor device and an inspection technology for carrying out defect analysis on electric properties of a wafer finished with fabricating steps.

An explanation will be given of inspection of a semiconductor wafer as an example.

It is necessary that a semiconductor device stores data written to a transistor for a predetermined period of time. For such purpose, there is formed a junction on a surface of a substrate and electric charge stored in the transistor is prevented from being leaked under a condition other than predetermined potential. When leakage failure (retention failure) occurs, for example, in the case of a memory product, written data vanishes.

As a method of evaluating such a leakage failure, there is known a method of carrying out an electric test on a finished product and directly evaluating electric properties. However, even when leakage failure occurs at an initial stage of fabrication, that is, a stage of ion implantation and heat treatment for forming a junction, presence or absence of the leakage failure cannot be detected until the product is finished and the electric test is carried out.

As a method of evaluating a wafer by using electron beam at a middle stage of steps, there is a description with regard to a method of evaluating presence or absence of leakage failure by measuring substrate absorption current in Japanese Patent Laid-Open No. 326165/1994. Further, there is a description with regard to a method of inspecting an electric defect of a semiconductor circuit by utilizing potential contrast in Japanese Patent Laid-Open No. 121561/1999 and Japanese Patent Laid-Open No. 8278/1999.

Although there is the description with regard to the method of evaluating presence or absence of failure by measuring the substrate absorption current in Japanese Patent Laid-Open NO. 326165/1994, the substrate current is very weak and therefore, it is necessary to scan thereof by retarding scan speed of electron beam and the presence or absence cannot be evaluated with regard to an area of a wide range at high speed. Further, there is not a description with regard to a method of inspecting junction leakage failure at all.

Next, concerning Japanese Patent Laid-Open No. 121561/1999 and Japanese Patent Laid-Open No. 8278/1999, with regard to a transistor having a junction, although a description is given to a method of detecting opening/nonopening of a hole pattern or wiring shortage by a secondary electron amount, there is not a description with regard to a method of inspecting junction leakage failure at all.

As described in the conventional technologies, with regard to leakage failure, particularly junction leakage caused in a semiconductor device, there is only a method of electrically inspecting a chip finished with preceding steps. However, a step of ion implantation or heat treatment for forming a junction is at an initial stage of fabrication steps and therefore, even when a failure occurs at the stage, the failure cannot be detected until the wafer is finished and the electric test is carried out and a time period is required since occurrence of failure until a countermeasure thereagainst is executed.

Further, at a stage of developing a semiconductor, a failure in forming a very fine pattern is liable to cause at respective process. When such a failure occurs, leakage failure cannot be detected even by the electric test. That is, conventionally, after development of a process of forming a very fine pattern has been finished and a failure is not caused in the fabrication process, a failure at an initial stage of fabrication is detected by using a finished wafer and therefore, an enormous time period of several months level is consumed as a countermeasure thereagainst, which constitutes a factor of retarding a time period of developing a semiconductor.

Further, when the electric test is carried out, it is necessary to bring a stylus into contact with a wafer and therefore, there poses a problem that only a finished wafer can be inspected. Further, in order to bring a stylus into contact with a transistor one by one, it is necessary to use an extremely fine needle and a time period is required for touching the needle and therefore, there poses a problem that it is difficult to apply measurement on transistors one by one.

Further, according to the inspection method in which electron beam is irradiated to a transistor and a leakage amount is measured by absorption current, the absorption current amount is very weak and therefore, an enormous time period is required for measuring one location and there poses a problem that the inspection method is inappropriate for inspection for finding out a failed portion in a wide area.

SUMMARY OF THE INVENTION

It is an object of the invention to resolve the above-described problem and provide an inspection technology of directly inspecting a wafer in the midst of steps, particularly, in the midst of a preceding step and provide an inspection method for specifying location of junction leakage which cannot be determined from a shape thereof in noncontact with a wafer and at high speed. Further, it is an object thereof to provide a technology for grasping a distribution of leakage failure and leakage current at an initial stage of fabrication and predicting yield of the sample and a fabrication process by providing a method of inspecting the wafer in the midst of steps in noncontact and at high speed.

Further, it is an object of the invention to provide a method and a system of inspection and a method of fabricating a semiconductor capable of optimizing a junction forming process and executing a process control by applying the technologies to many kinds and many steps of fabricating semiconductor devices and other fine circuit patterns at an early stage, reflecting the result to fabrication conditions and promoting reliability of semiconductor devices and reducing a failure rate.

As a method of inspecting a semiconductor device by electron beam, for example, there is a method of finely focusing electron beam of very small current as in a length measuring SEM, irradiating the electron beam to a wafer and forming an image to thereby observe a very fine shape and measure a line width, however, although the shape can be observed, failure of junction leakage cannot be detected.

Further, as in SEM type wafer automatic outlook inspection system, there is a method of forming an image by irradiating a sample with large current electron beam by a single time or a plurality of times at high speed and automatically inspecting defect such as opening or short circuit of an electric circuit by potential contrast. However, also according to the method, no consideration is given to specifying a failed location of junction leakage.

Hence, the inventors have found that in order to detect leakage failure by utilizing a potential contrast image formed by irradiating electron beam, firstly, it is necessary to inspect a wafer formed with a junction and it is necessary to control to charge the wafer such that rearward bias is constituted for the junction. For example, in the case of semiconductor formed with pn junction, it is necessary to control the surface to charge in positive. Means for controlling thereof can be executed by adjusting irradiation energy of electron beam, electron beam current, scanning speed a number of times of irradiation and timings thereof.

According to a conventional system, normally, electron beam current is constant, further, electron beam scanning speed is fixed. Further, also in the case of forming an image by irradiating electron beam by a plurality of times, when the scanning speed is fixed and a pixel size in forming the image is fixed, an interval of irradiating electron beam to the same location and the same transistor is also fixed.

The inventors have found that in order to charge a transistor normally formed with a junction in positive as mentioned above and produce a saturated state thereof, it is necessary to continue to irradiate electron beam to the same location of a transistor at short intervals by a plurality of times. Thereby, although the normal location is charged to positive and reaches the saturated state, when leakage is caused, even when the location is charged, electrons are immediately supplied from a substrate and the charge is alleviated. As a result, when electron beam of predetermined current is irradiated at short intervals, there is produced a difference in charge level between a normal location and the location causing leakage and when the difference is observed as potential contrast, the difference can be differentiated as a difference of brightness and darkness, which has been found by the inventors.

When secondary electrons generated by charging the transistor in positive, are visualized, in the case of a normal transistor, the charge voltage is high and therefore, the potential contrast image looks dark, however, at a location where the charge voltage is low by causing leakage, the potential contrast image looks bright. From the brightness of the image, by, for example, comparing equivalent patterns, the failure causing portion can be specified. Further, the failure causing portion can be specified by previously storing a reference image equivalent to a normal junction forming portion and comparing the brightness with brightness of the wafer to be inspected. Further, by previously measuring potential and calculating a relationship between predetermined brightness and potential, from an absolute value of brightness of the acquired potential contrast image, the acceptability can be determined.

In order to realize the inspection, the inventors have investigated conditions of irradiating electron beam. As a result, the inventors have found that by making the electron beam current, electron beam irradiation time period, an interval time of irradiating electron beam variable and controlling thereof independently, brightness or darkness of potential contrast of an electron beam image can be changed in correspondence with leakage current or retention time period by which the inspection is to be executed. The electron beam current can be changed by voltage of a condenser lens, a focusing unit and various electrodes and the electron beam irradiation time period can be changed by changing scanning speed or magnification. Further, with regard to irradiation interval time, by scanning an irradiation region by vector scanning and adjusting an interval between irradiations by a blanking time period, the irradiation interval time period can arbitrarily be made variable.

Next, in detecting the signal of secondary electrons for forming an electron beam image, when an electron image is formed after causing a potential difference between a normal portion and a leakage failure portion by irradiating electron beam by a plurality of times, the contrast between the normal portion and the failed portion is increased, which facilitates to detect the failed portion in an image processing. As means therefor, the inventors irradiate electron beam to the same location by a plurality of times and in forming the image, there is used an image at an n-th time and thereafter of irradiating electron beam which has previously designated in forming the image. The value "n" is variable in accordance with the above-described conditions of irradiating electron beam.

Further, in order to form the electron beam image by the above-described method to thereby acquire consecutively the electron beam image with regard to a previously designated inspection region, a stage is moved by step and repeat, there is repeated operation of acquiring the electron beam image at the location, moving the stage to a successive location and acquiring an image of the location to thereby execute inspection of the designated region. At this occasion, there is acquired the electron image at the n-th time and thereafter by vector scanning at high speed by the above-described means, the image processing is executed in real time, with regard to a location constituting a candidate of failure, the electron beam image is automatically preserved, thereby, leakage can be inspected at high speed and in a wide range. While executing the inspection, when failure is detected, a failed portion is displayed in a map, leakage current or retention time period is calculated from brightness of an image of the failed portion and subjected to a frequency distribution display, thereby, the level of occurrence of failure can be grasped at a glance.

The inspection is executed in this way and it is found that by executing similar inspection at the same location under a plurality of conditions and grasping the frequency distribution in correspondence with a plurality of retention time periods, there can be derived characteristic of retention time of a wafer to be inspected.

Further, by applying the inspection in constructing a semiconductor process and using the inspection method as determining means in constituting conditions in, for example, a junction forming process, the inspection is executed at a step of time point at which ion implantation of forming a junction has been finished and determination of acceptability of process conditions is executed, thereby, the process can be optimized at an early stage.

By executing the inspection method and by using the inspection system having the functions, leakage failure can automatically be found by using a wafer in the midst of steps and the inspection of determining the acceptability of the process can be executed. A description will be given as follows of means for realizing the inspection method.

According to first means, electron beam is irradiated to a wafer at a step having a junction under a condition in which the junction constitutes rearward bias and irradiated thereto by a plurality of times at short intervals, thereby, a portion normally formed with a junction is controlled to charge and reach a state proximate to saturation. For example, in the case of pn junction, the wafer is charged in positive and for that purpose, electron beam having low irradiation energy is made incident on the wafer. Thereby, by irradiating electron beam by a plurality of times, the portion normally formed with a junction, becomes dark in a potential contrast image since the charge voltage is high and the portion of causing leakage failure becomes bright since the charge voltage is low and therefore, the portion of causing leakage can be recognized by the potential contrast image.

According to second means, in order to make the inspection executable in accordance with leakage current or retention time period constituting an object of the inspection, electron beam current, electron beam irradiation time period and beam irradiation interval time are set independently from each other. The electron beam current can be changed by voltage of the condenser lens, the focusing unit and various electrodes and the electron beam irradiation time period can be changed by changing the scanning speed or the magnification. Further, with regard to the irradiation interval time, the irradiated region is scanned by vector scan and the interval between irradiations can be adjusted by blanking time period. By combining these, there are can set inspection conditions in correspondence with desired retention time.

According to third means, a signal at and after an "n"-th time previously designated is acquired and visualized in detecting the signal. Thereby, a contrast between a normal portion and a leakage failure causing portion can be increased and a sensitivity of detecting the failed portion can be promoted.

According to fourth means, there is adopted an inspection method in which an image is formed consecutively by the above-described means while moving a sample base in step and repeat and an image of a portion where a candidate of failure is present, is automatically preserved while executing an image processing in real time. With regard to the image processing, there are investigated a method of comparing and inspecting equivalent patterns, a method of previously acquiring a reference image of an acceptable product and comparing and inspecting thereof with the reference image and a method of determining acceptability from an absolute value of brightness by information of potential. By executing any of these, there can be provided information of a leakage failure causing portion of a designated region.

According to fifth means, the detected failed portion is displayed on a map, a failure occurrence frequency with regard to leakage current or retention time period is displayed by a frequency distribution, further, coordinates of failure causing portion can be outputted by external communication, further, coordinate information can be transmitted and received to and from outside. Thereby, a comparison with information of an electric test can be executed and a correlation with other inspection system can be evaluated, a characteristic distribution of defect can be grasped by a distribution display and can be used for specifying cause. Further, by a frequency distribution display of a failure frequency with regard to leakage current or retention time period, a correlation with a result of the electric test can easily be calculated.

According to sixth means, the inspection by the above-described means is applied in setting fabrication conditions of a semiconductor process and a wafer at a step after forming a junction is inspected, thereby, the acceptability of the process can be determined promptly. Thereby, an optimum condition of the junction forming process can be determined by the inspection.

By the above-described various means, electric leakage failure which cannot be determined by a shape in a semiconductor device can be determined by using a wafer at a step immediately after forming a junction, further, characteristic or distribution of causing leakage failure can be grasped by the inspection.

Further, in a semiconductor fabricating process, by using the inspection as means for optimizing conditions and monitoring whether the conditions are varied, determination of acceptability can be executed immediately after forming a junction and therefore, the conditions can be optimized by a fast cycle. Thereby, there can be dealt with cause of failure in a process of fabricating various substrates starting from a semiconductor device at speed and with accuracy higher than those of the conventional method and the conventional system, high yield, that is, high acceptability rate can be ensured and at the same time, TAT from when occurrence of a failure is detected until forming a countermeasure thereagainst can be shortened.

BRIEF DESCRIPTION OF THE DRAWINGS

FIG. 6 is a view showing operation in inspection;

DETAILED DESCRIPTION OF THE PREFERRED EMBODIMENTS

A detailed explanation will be given of embodiments of an inspection method and an inspection system according to the invention in reference to the drawings as follows.

Embodiment 1

According to the embodiment, a description will be given of an inspection method and an inspection system for inspecting presence or absence of leakage failure with regard to a semiconductor wafer in the midst of steps of fabricating thereof.

Figure 1:
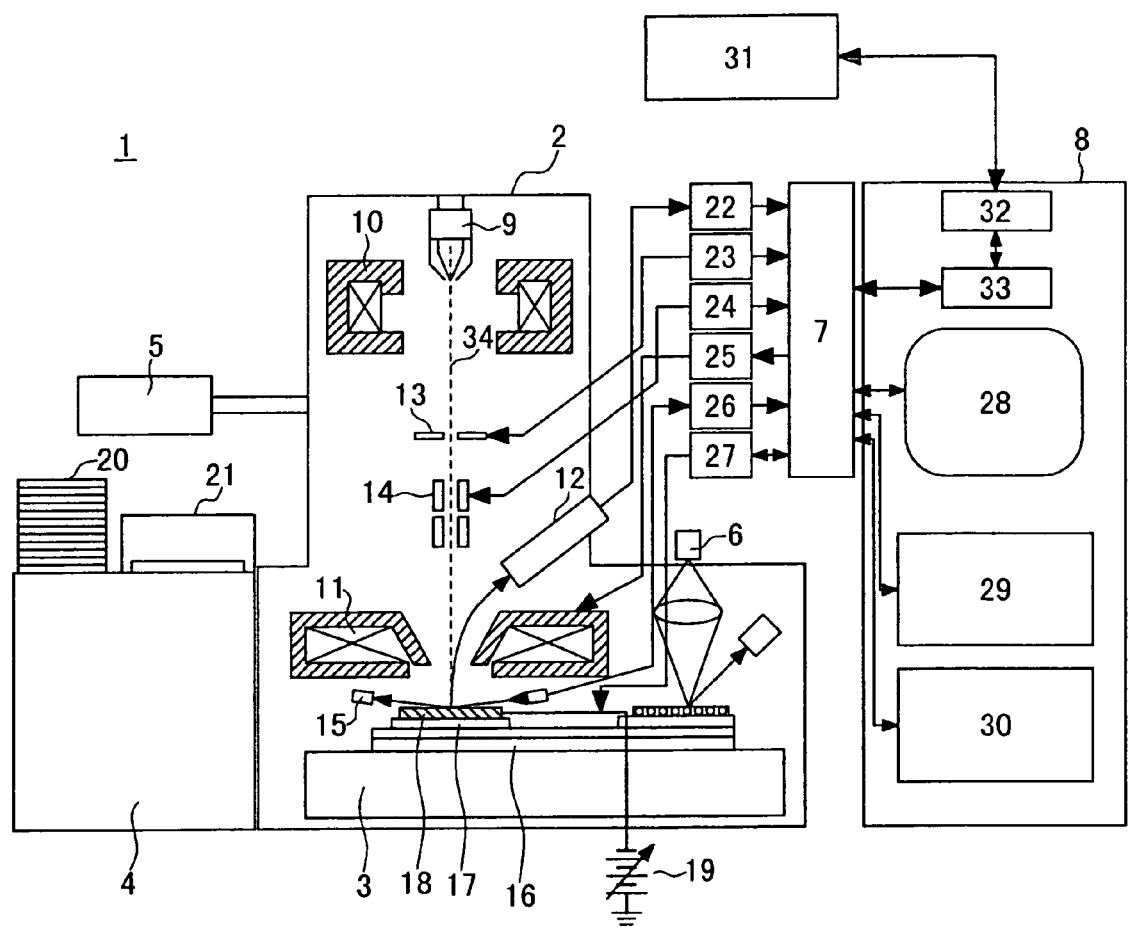
FIG. 1 is a constitution view showing a first embodiment of a semiconductor inspection system according to the invention.

First, FIG. 1 shows a constitution of an inspection system of a semiconductor device according to the embodiment. An inspection system 1 of a semiconductor device is constituted by an electron beam optics unit 2, a stage mechanism unit 3, a wafer handling unit 4, a vacuum unit 5, an optical microscope unit 6, a control unit 7 and a control unit 8.

The electron beam optics unit 2 is constituted by an electron gun 9, a condenser lens 10, an objective lens 11, a detector 12, a blanking deflector 13, a deflector 14 and a wafer height measure sensor 15.

The stage mechanism unit 3 is constituted by an XY stage 16 and a holder 17 for mounting a wafer, and a retarding power supply 19 for applying negative voltage on the holder 17 and a wafer 18. The XY stage 16 is attached with a position detector by laser length measurement. The wafer handling unit 4 is constituted by a wafer mounting case 20 and a wafer loader 21 and is moved between the loader 21 and the XY stage 16 in a state of being mounted with the wafer 18.

The control unit 7 is constituted by a signal detection control unit 22, a beam deflector control unit 23, a blanking control unit 24, an electron beam optics control unit 25, a wafer height measurement unit 26 and a mechanism/stage control unit 27. The control unit 8 is constituted by a graphical user interface, user interface unit 28, an image processing unit 29, an image/inspection data storage unit 30, a data input unit 32 for transmitting and receiving data to and from an outer server 31 and a data translate unit 33.

Figure 2:
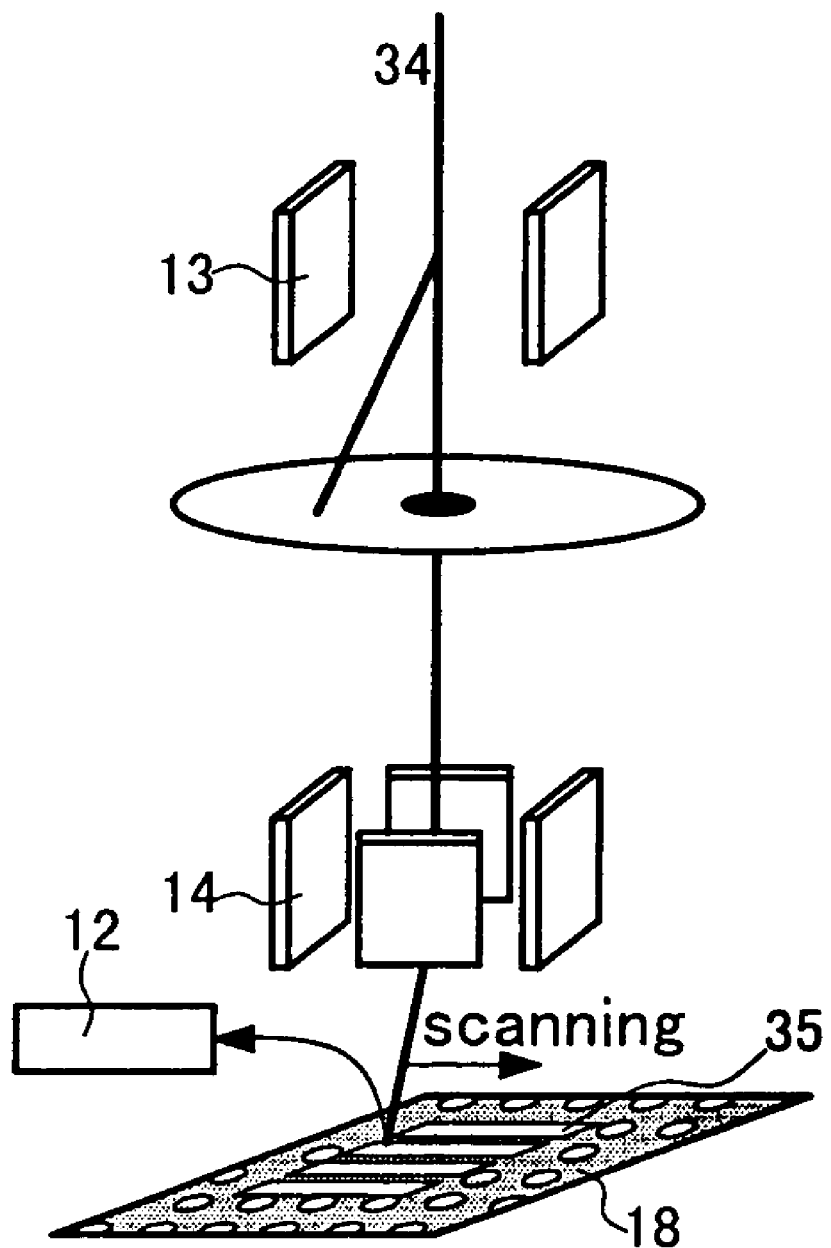
FIG. 2 is a conceptual view enlarging an electron beam irradiating unit.

FIG. 2 shows an enlarged view of the electron beam deflection control unit in FIG. 1. Electron beam 34 is controlled with respect to a timing of irradiating the sample wafer 18 by the blanking deflector 13 and when irradiating the sample wafer 18, scanning speed and a beam scanning area 35 are controlled by the deflector 14 and a signal is detected by the detector 12 in accordance with speed of scanning.

Figure 3:
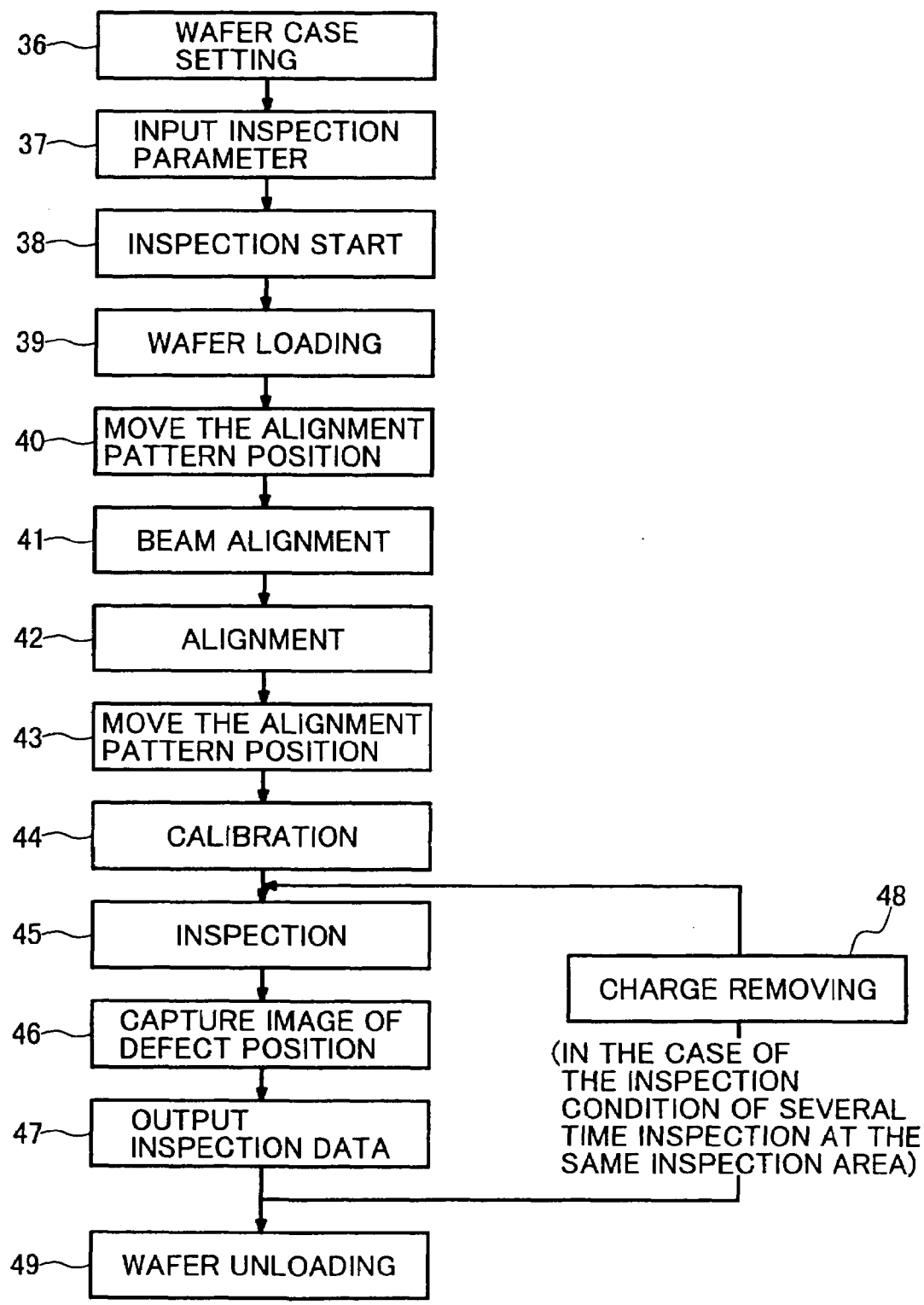
FIG. 3 is a diagram showing an inspection flow.

Next, an explanation will be given of operation of respective portions of the inspection system shown by FIG. 1 and FIG. 2 in accordance with a flow for inspecting retention failure. FIG. 3 shows the flow of inspection. A description will be given of the flow and operation of respective portions in reference to FIG. 1, FIG. 2 and FIG. 3 as follows.

First, a wafer cassette installed with wafers at arbitrary shelves, is placed at the cassette mounting case 20 in the wafer handling unit 4 of FIG. 1 (step 36 of FIG. 3).

Next, in order to designate a wafer to be inspected by the graphical user interface 28, there is designated a cassette inner shelf number set with the wafer. Further, various inspection parameters are inputted by the graphical user interface 28 (step 37 of FIG. 3). As inputted content of the inspection parameters, there are inputted content of electron beam current, electron beam irradiation energy, scanning speed and signal detection sampling clock, view field size per screen, blanking time for respective scanning, a number of times of acquiring an image per screen, acquired image used for image processing, inspection area, various information with regard to the wafer 18 to be inspected, whether a plurality of respective wafers are continuously inspected automatically and whether the same wafer is continuously inspected under different inspection parameters. Although individual parameters can be inputted, normally in accordance with retention time to be inspected, a combination of the various inspection parameters is formed into a data base as an inspection parameter file and an inspection parameter file in accordance with retention time may be selected and inputted. When input of the parameters has been finished (step 37 of FIG. 3), at step 38, inspection is started (step 38 of FIG. 3).

When automatic inspection is started, firstly, the set wafer 18 is transferred into the inspection system 1. According to the wafer handling unit 4, even in a case in which the diameter of the inspected wafer 18 differs and even in a case in which the wafer shape differs such as an orientation flat type or a notch type, the cases can be dealt with by exchanging the holder 17 for mounting the wafer 18 in correspondence with the size or the shape of the wafer. The inspected wafer 18 is mounted from the cassette 20 to the holder 17 by the wafer loader 21 including a preparatory vacuum chamber, held and fixed thereby, vacuumed at inside of the wafer loader 21 along with the holder and is transferred to an inspection chamber which has already been vacuumed by the vacuum unit 5. (step 39 of FIG. 3) When the wafer is loaded, based on the inputted inspection parameters, there are set electron beam irradiation conditions from the electron beam optics control unit 25 to respective portions. Further, the stage 16 is moved such that a pattern for beam alignment 50 mounted onto the wafer holder 17 comes under the electron beam optics unit (step 40 of FIG. 3), there is acquired an electron beam image of the pattern for beam alignment 50 and focal point and astigmatism are adjusted by the electron beam image. Further, the electron beam is moved to a predetermined portion of the inspected wafer 18, an electron beam image of the wafer 18 is acquired and contrast is adjusted. At this occasion, when it is necessary to change the electron beam irradiation parameters, the parameters can be change and beam correction can be executed again. Simultaneously, the height of the wafer 18 is calculated by the height measure sensor 15, there is calculated a correlation between the height information and a focusing condition of the electron beam by the wafer height measure unit 26 and when acquiring the electron beam image thereafter, the electron beam is automatically adjusted to the focusing condition from a result of detecting the wafer height without executing the focusing at respective time. Thereby, the electron beam image can be acquired continuously at high speed (step 41 of FIG. 3).

Figure 5:
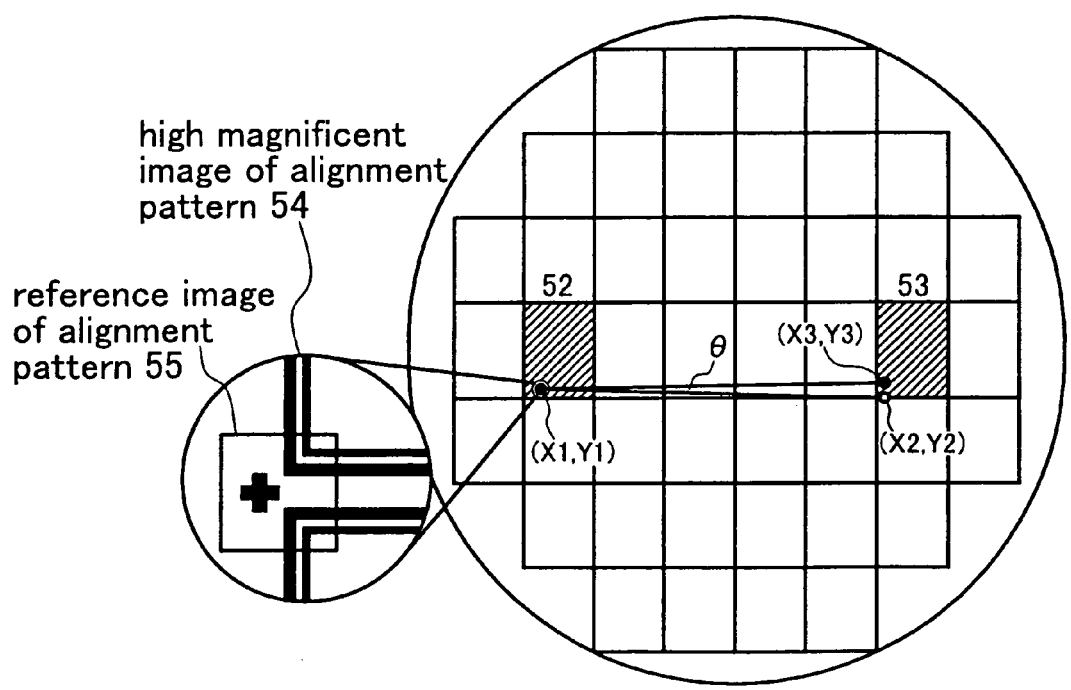
FIG. 5 is a view showing an alignment method.

When adjustment of the electron beam irradiation parameters as well as the focal point and the astigmatism has been finished, alignment is executed by two points on the wafer 18 (step 42 of FIG. 3). There is shown a method of alignment according to the embodiment in reference to FIG. 1 and FIG. 5. In order to execute automatic alignment necessary for executing a review automatically, there is previously used a wafer having a pattern equivalent to that of the observed wafer, an optical microscope image and an SEM image of a chip for executing alignment, a pattern formed for alignment or a pattern suitable for alignment and position information in the chip where the alignment pattern is present, are calculated and registered such that existing set coordinates and reference images for alignment can be read in inputting the inspection parameters (step 37 of FIG. 3).

According to the inspection, it is necessary to put a set area in a wafer or in a chip under a view field with high accuracy. For that purpose, before putting a defect portion under a view field, by using the alignment parameter and alignment image previously registered by the above-described method, the alignment is executed automatically (step 42 of FIG. 3). As has already been described, as a portion where the alignment pattern is already present, an optical microscope image (52 in FIG. 5) and an electron beam image 55 of the designated portion are registered in a memory and names of the images and coordinates of alignment targets designated (two points; X1, Y1, X2, Y2) are registered in the inspection parameter file.

According to the alignment, when there is present an alignment pattern 54 on the first chip 52, the sample base is moved to coordinates registered in the inspection parameter file, first, an image is acquired by the optical microscope 6, there is automatically searched a portion coinciding with an optical microscope image which has already been registered by an image processing and when detected, coordinates of detected point are calculated by operation. Based on the detected coordinates, there is acquired the electron beam image 55 at the same portion, there is automatically searched a portion coinciding with an electron beam image which has already been registered by an image processing and when detected, coordinates (X1, Y1) of a detected point are calculated by operation and stored as coordinates of the first alignment chip.

Next, also with regard to the second alignment chip 53 disposed at a parallel position on a matrix of a circuit pattern, the stage is moved similarly to a portion where the alignment pattern seems to be present. For that purpose, similar to the first alignment chip, by an optical microscope image 52' and an electron beam image 55', there are searched portions coinciding with images which have already been registered respectively by image processings, and coordinates (X2, Y2) of the detected portion are calculated by operation and stored as coordinates of the second alignment chip. By a coordinate deviation between two points of an anticipated position of the second alignment chip calculated from the alignment mark position (X1, Y1) on the first alignment chip and data of a chip size and the coordinate position of (X2, Y2) provided by actually acquiring the image, that is, by deviation amounts in X direction and Y direction, there is calculated a rotational amount θ of an arrangement of a circuit pattern on the inspected substrate with regard to the direction of moving the stage and from the rotational amount θ, there is determined an amount of correction of a direction of scanning electron beam. Further, by detecting positions of the alignment patterns (X1, Y1, X2, Y2) and calculating an offset value from the coordinate values and magnification of the coordinate system, the inspection area or the inspection start point can be detected in conformity with the position of the circuit pattern on the inspected wafer.

When the alignment has been finished, based on the alignment result, rotation or coordinate values are corrected, successively, the electron beam is moved to the second alignment pattern 51 mounted on the sample holder 17 (step 43 of FIG. 3). The second alignment pattern 51 is that of a transistor where a junction is previously formed normally or a pattern in correspondence with a transistor and by using the pattern 51, brightness of a normal portion is corrected. Based on the result, the electron beam moves onto the wafer 18, there is acquired an image of a pattern portion on the wafer and there is executed adjustment of brightness, that is, calibration (step 44 of FIG. 3).

When the calibration has been finished, there is executed inspection (step 45 of FIG. 3). A detailed explanation will be given later of the inspection method. While executing inspection of the designated area, an image processing is executed in real time and an image is automatically preserved with regard to a defect portion (step 46 of FIG. 3). Further, the inspection result is displayed at the control portion 28 and data is outputted to outside via the data conversion portions 32 and 33 (step 47 of FIG. 3).

In inputting the inspection parameters (step 37 of FIG. 3), when there is set inspection of the same portion by a plurality of times under different parameters, there is executed a processing for removing charge to an area which has been inspected once (step 48 of FIG. 3). Although a charge removing portion is not illustrated in FIG. 1, for example, the processing of removing charge is executed by irradiating ultraviolet ray.

Further, inspection is executed again under different electron beam irradiation parameters (step 45 of FIG. 3). When inspection has been finished in this way, the wafer is unloaded and the inspection is finished (step 49 of FIG. 3).

Next, a detailed explanation will be given of an inspection method for inspecting retention failure as follows. FIG. 6 shows a conceptual view for operation when the electron beam 34 is irradiated to the wafer 18. According to the structure of the sample, an isolation 62 is formed above a substrate 61 and respective transistors are isolated by the isolation 62. The transistor portion is constructed by a structure in which there is present a hole pattern for embedding a plug portion 57 and although the substrate 61 and the plug 57 are conducted to each other, the plug pattern is surrounded by an insulator layer 58.

Further, there is formed a pn junction 60 at the substrate portion right under the plug 57. According to the embodiment, there is used a p-type substrate as the substrate and there is used a polysilicon film doped with n-type ions as a plug embedding material. The electron beam 34 is made incident on the sample. Here, with regard to irradiation energy of the electron beam, there is selected a condition that a secondary electron emitting efficiency of the plug portion 57 is higher than 1. According to the embodiment, irradiation energy is set to 500 eV. Further, electron beam current is set to 5 nA and scanning speed of beam and sampling clock of signal are set to 50 MHz. The conditions of irradiation can arbitrarily be set within designated ranges. For example, the electron beam current can be set in a range of 10 pA through 100 nA and the sampling clock can be set in a range of from 100 kHz through 100 MHz.

When the electron beam is irradiated to the sample under the above-described conditions, there are generated secondary electrons 56 more than the irradiated electron beam 34. As a result, the plug portion 57 is charged to positive. Although the plug 57 is conducted to the substrate 61, there is present the pn junction 60. In the pn junction, current flows when there is a depletion layer at a boundary of the junction and potential is applied in forward bias, however, current does not flow when the potential is applied in rearward bias. According to the embodiment, a surface of the plug in correspondence with an n region is charged to positive and therefore, there is brought about the rearward bias state. Therefore, current does not flow from the substrate 61 in correspondence with a p region and supply of electron is extremely small. Therefore, it takes a long period of time until the charged electric charge is alleviated. However, when there causes leakage in the pn junction, supply of electron from the substrate 60 is comparatively increased and therefore, the time period of alleviating positive charge of the plug 57 is shortened. The charge alleviating time period differs by a charge amount of the plug 57, a capacity of the plug 57 and a leakage current amount.

Figure 7A:
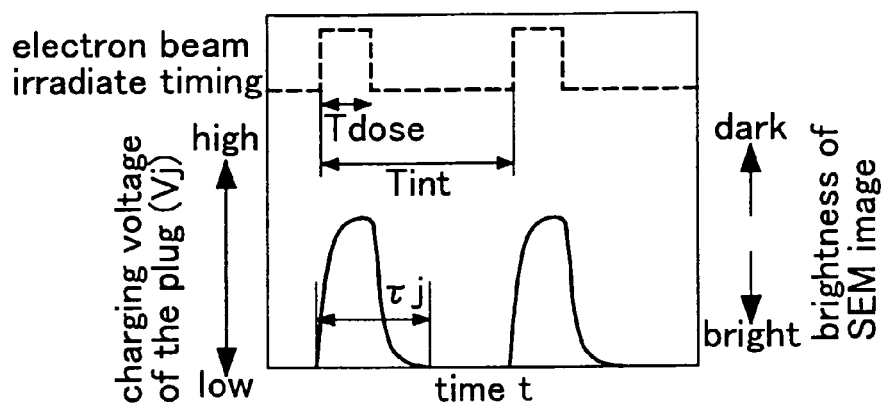
FIGS. 7A through 7C are views for explaining inspection principle.
Figure 7B:
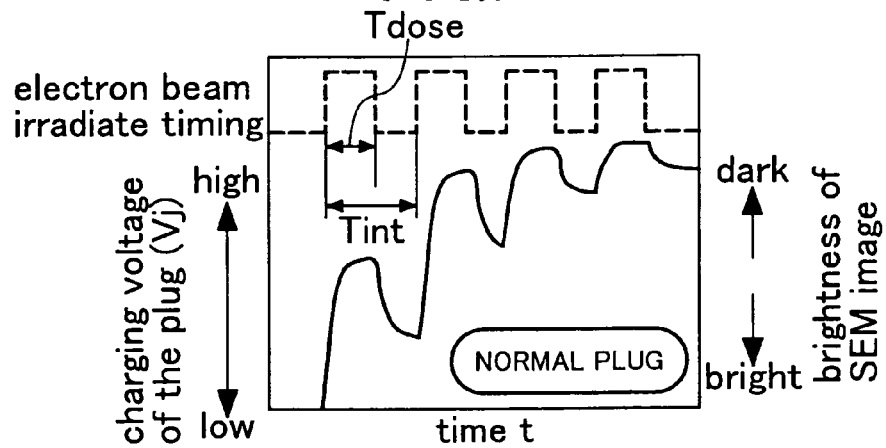
Figure 7C:
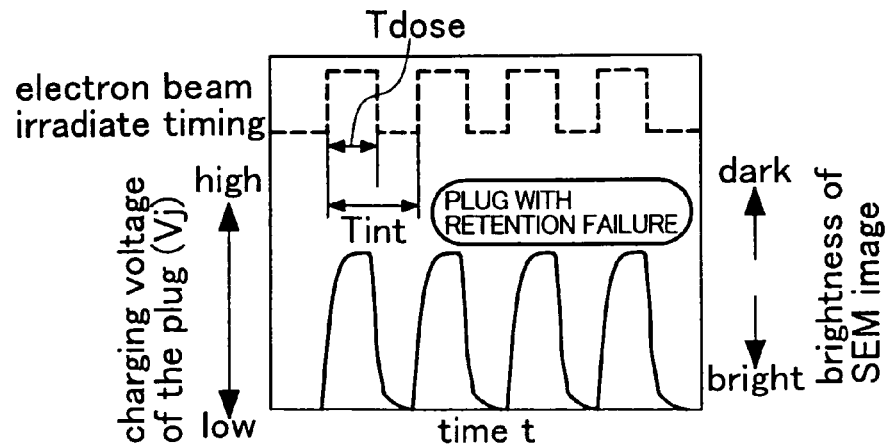

An explanation will be given of a method of irradiating electron beam for detecting retention failure in reference to FIGS. 7A, 7B and 7C. FIGS. 7A, 7B and 7C are diagrams showing a behavior of alleviating charge when electron beam is irradiated to the same transistor by a plurality of times. For example, electron beam current is set to 1 through 5 nA, the scanning speed and the sampling clock are set to 50 MHz through 100 MHz and the plug charge voltage is set not to reach a saturated state by one time of beam irradiation. Under the conditions, electron beam is irradiated to the same transistor by a plurality of times.

FIG. 7A shows a behavior of charge voltage when intervals of irradiating electron beam in the case of a plurality of times of irradiation, is sufficiently long. Charge voltage (Vj)

per irradiation is determined by time period (Tdose) of irradiating electron beam. Leakage current (IL) is calculated by a relationship between the charge voltage (Vj) and resistance (Rj) of the junction. Further, charge alleviating time (τj) is calculated by a product of the resistance (Rj) and capacitance (Cj) of the junction. When an interval (Tint) of irradiating electron beam is longer than the charge alleviating time (τj), in both of a plug having normal pn junction and a plug causing leakage failure, the charge voltage is completely alleviated until next irradiation and therefore, the potential difference is not produced.

However, as shown by FIG. 7B, when electron beam is irradiated by a plurality of times under a condition in which the irradiation interval (Tint) is shorter than the charge alleviating time (τj) having normal pn junction, charging is progressed at the normal pn junction to reach a saturated state.

Figure 4:
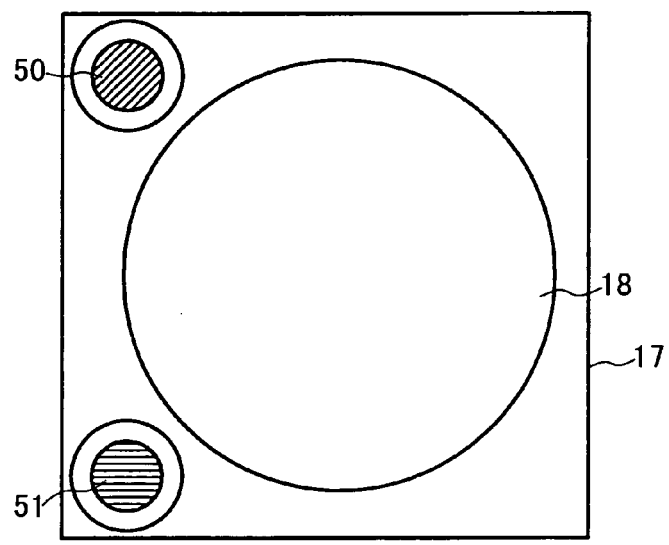
FIG. 4 is a view showing an alignment pattern arrangement.
Figure 8:
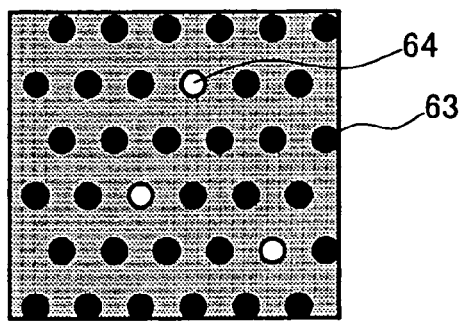
FIG. 8 is a view showing an image provided in inspection.

However, as shown by FIG. 7C, in the case of the plug causing leakage failure, the charge alleviating time (τj) is shorter than that of a normal portion and therefore, the charge is alleviated at the respective irradiation and the charge level stays to be low even by a plurality of times of irradiation. Therefore, as shown by FIG. 8, there is produced potential difference between a normal portion and a portion causing leakage failure, brightness of potential contrast is changed in accordance with the potential difference and therefore, a normal bit 63 is uniformly darkened and only a retention failure bit 64 looks bright. By comparing the image with an equivalent pattern and comparing the brightness with brightness of a pattern in correspondence with normal pn junction acquired in the second alignment pattern (51 of FIG. 4), a failure causing portion can be specified.

Figure 9:
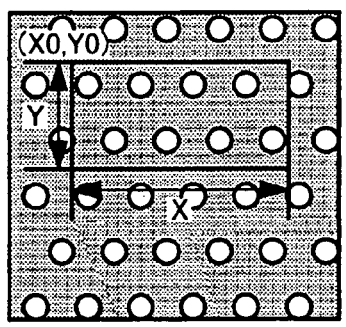
FIG. 9 is a view showing inspection condition input parameters.

In order to control a sensitivity of detecting leakage failure, the control can be realized by variably setting electron beam irradiation timing, charge voltage per irradiation and number of times of irradiating electron beam as shown by FIGS. 7A through 7C. The electron beam irradiation timing can be controlled by a method shown by FIG. 9. That is, the scanning speed of electron beam is determined and in addition thereto, a time period per scanning, that is, the scanning width is made to be able to set arbitrarily. Further, by arbitrarily changing image size X and Y in XY scanning, there can be controlled a time period from when electron beam is irradiated to a certain transistor portion to when electron beam is irradiated thereto again. When the timing interval is intended to retard, by blanking an interval between scanning and successive scanning, the timing can be adjusted. According to the embodiment, the electron beam current is set to 5 nA, the scanning speed is set to 50 MHz and the irradiation interval sets to a range of 100 μs to 50 μs described above. As a result, the retention failure is succeeded to detect.

Figure 10A:
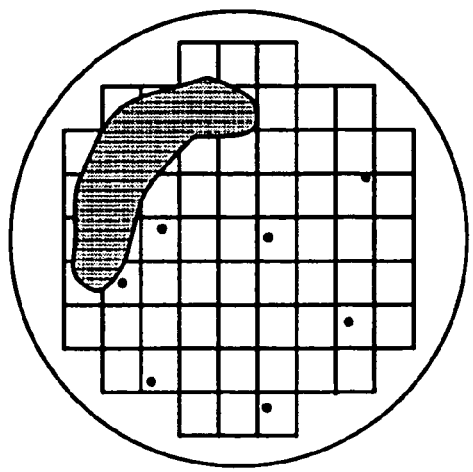
FIGS. 10A and 10B are views showing an output of an inspection result.
Figure 10B:
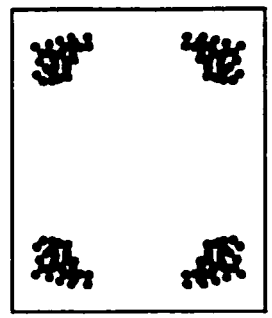

FIGS. 10A and 10B show an example of displaying an inspection result. FIG. 10A shows portions of causing leakage failure as a result of inspection by a distribution on a wafer. Further, FIG. 10B shows the portions by a distribution on a chip. The retention failure is significantly influenced by conditions of process and therefore, there are cases in which the retention failure is easy to cause at, for example, a surrounding of a wafer and easy to cause at a surrounding of a chip. In order to precisely grasp characteristics of the distributions, the above-described display of result becomes necessary.

Embodiment 2

Figure 11:
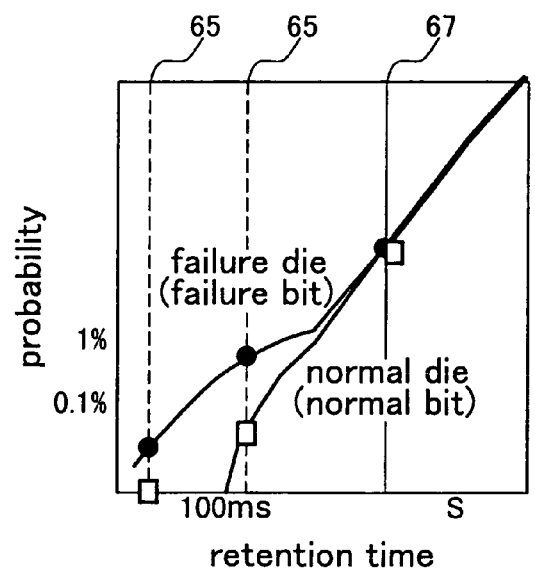
FIG. 11 is a diagram for explaining a second embodiment according to the invention.

According to a second embodiment, the result of inspection in the first embodiment is displayed by a probability. FIG. 11 shows an example of display of the probability. Although the probability can be calculated by bit numbers at respective retention time period, in an actual inspection, it is substantially impossible to execute an inspection in correspondence with all of the retention time periods. Hence, according to the embodiment, by combining various inspection parameters explained in the first embodiment, there are set inspection conditions in correspondence with three kinds of retention time periods and the inspection is executed. As a result of inspection by a first inspection condition, there are detected bits of a retention time period in correspondence with numeral 65 of FIG. 11, the result is inputted to the probability and by a similar method, there are calculated bit numbers of retention time periods in correspondence with numeral 66 of FIG. 11 and numeral 67 of FIG. 11 and the bit numbers are inputted to the probability. As a result, there can be detected a difference in characteristic between a normal die and a failure die.

For example, when measurement is executed by setting beam current to 5 nA, setting a time period (Tdose) of irradiating a pattern with beam to 30 ns and the beam irradiation interval (Tint) to 10 ms, with a retention time period of about 100 through 200 ms as a boundary, a die having a retention time period longer than the boundary becomes dark and a die having a retention time period shorter than the boundary becomes bright. Therefore, by measuring probabilities of bright dies, the frequency can be calculated.

Embodiment 3

According to a third embodiment, there is shown an example in which the invention is applied to a leakage failure inspection of a flash memory product. According to a flash memory, accumulation and erasure of charge is executed via a floating gate. Therefore, when there is present a defect at an oxide film between the gate and a substrate and leakage is caused, a failure is constituted. By applying the inspection method, leakage failure between the gate and the substrate can be detected. Further, in the case of causing leakage between the source and the drain, when the cause is derived from crystal failure, by inspecting a plug pattern on the substrate, portions of causing the leakage failure can be specified.

Embodiment 4

Figure 12:
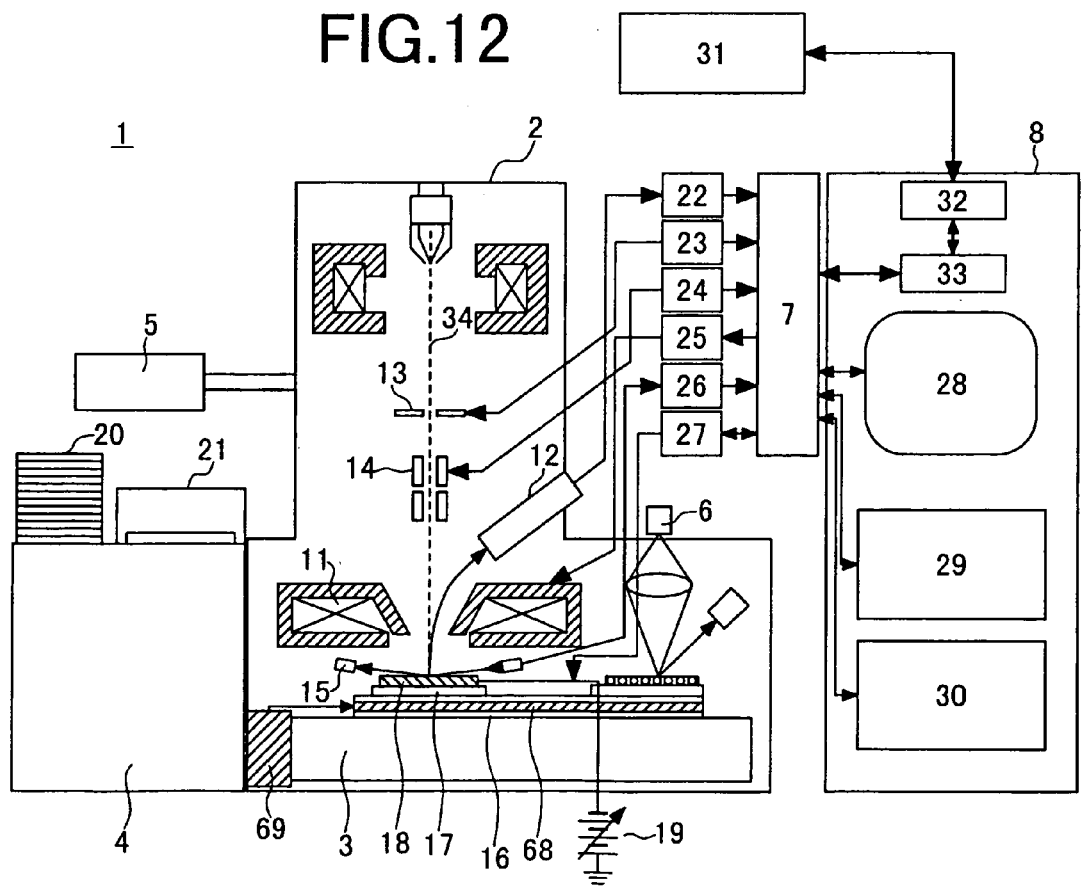
FIG. 12 is a constitution view showing a fourth embodiment of the invention.

According to a fourth embodiment, as shown by FIG. 12, a heater 68 and a temperature control unit 69 are added to the sample base to thereby enable inspection at high temperatures.

In the case of the retention failure, characteristic of leakage current is changed by temperature. Even in the case of leakage current at a region where a difference is difficult to produce at room temperature, the difference can be produced in the characteristic of alleviating charge by elevating temperature.

In the same apparatus constitution, it is also possible to execute inspection at low temperatures by changing the heater portion to a cooling unit.

Embodiment 5

Figure 13:
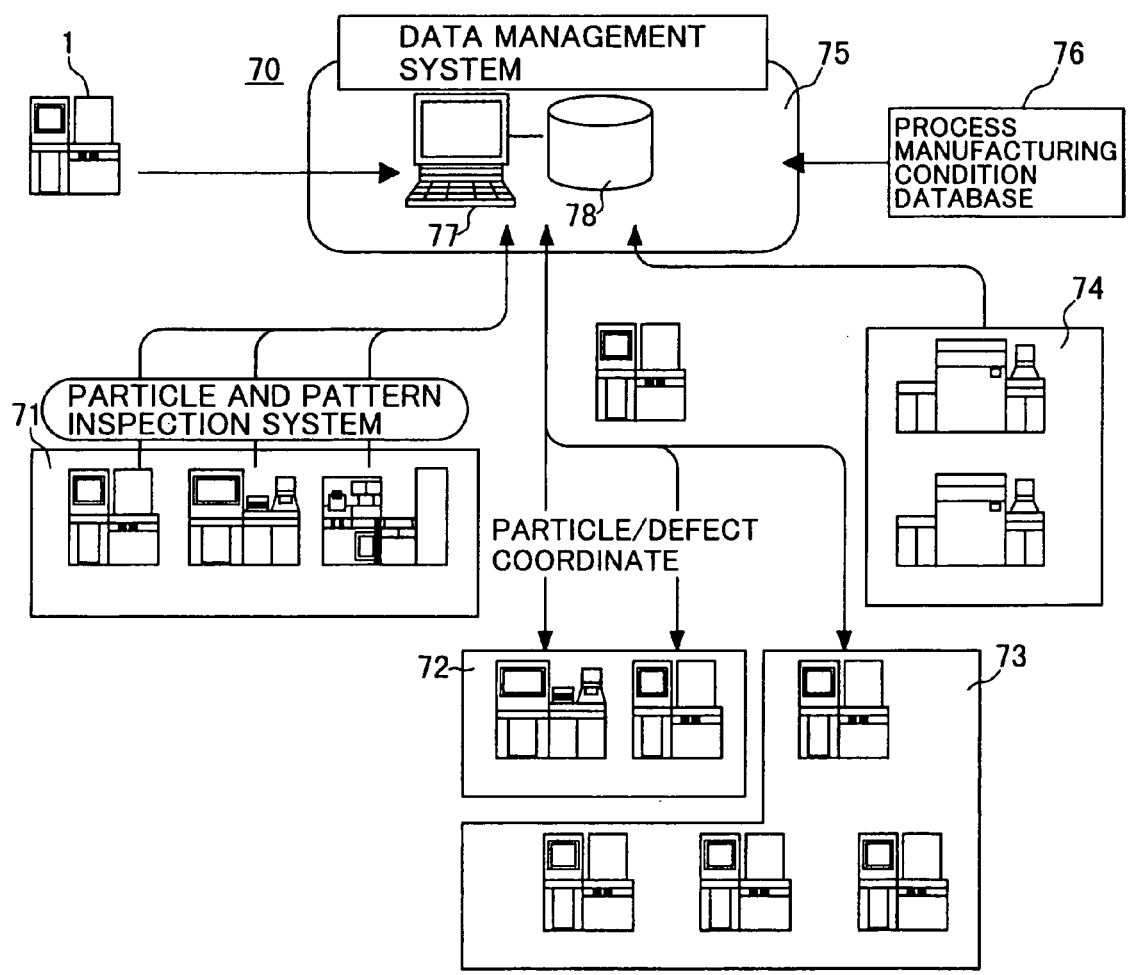
FIG. 13 is a view for explaining a constitution of an inspection system according to a fifth embodiment of the invention.

A fifth embodiment is an embodiment of an inspection and analysis system in a semiconductor fabricating process including the inspection method and the inspection system described in the first through the fourth embodiments. FIG. 13 shows an outline view of an inspection and analysis system in a semiconductor fabricating step. A system 70 is constituted by the inspection system 1 according to the invention, particle and pattern inspection system 71, a review system 72, a defect analysis system 73 such as FIB, section SEM or TEM, a tester 74 for executing electric test, a data management system 75 and a process manufacturing condition data system 76.

A result of inspection by the inspection system 1 according to the invention is recorded to a data base 78 via a server 77 in the data storage system 75. By evaluating a correlation between the data and a result of the electric test 74, or evaluating a change in causing failure in accordance with a process fabrication condition, yield control can be executed, and when failure is caused, there can promptly be analyzed a correlation between an inspection result of other inspection system and process condition, and cause of occurrence of failure can be assessed at an early stage. Therefore, although conventionally, several months is required from when failure is caused to when a countermeasure thereagainst is executed, by applying the inspection method and the inspection system of this application, the countermeasure can be executed in one through several days since the failure is caused and the efficiency of development and fabrication of a semiconductor is remarkably promoted.

Embodiment 6

According to the embodiment, an explanation will be given of a case of applying the above-described inspection method to a semiconductor fabricating method.

Figure 14:
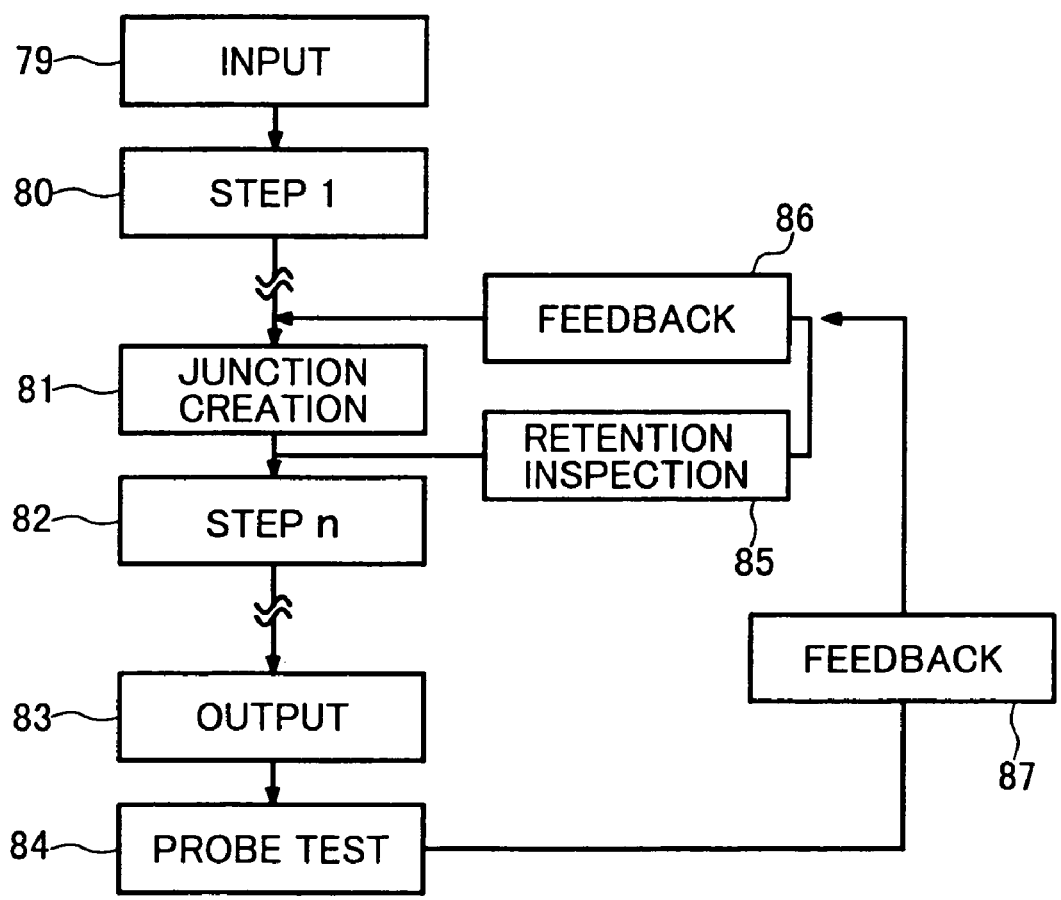
FIG. 14 is a diagram showing a flow of a semiconductor fabrication process according to a sixth embodiment of the invention.

FIG. 14 shows a flow of semiconductor fabricating steps. Although according to the conventional method, the process is started (step 79 of FIG. 14), preceding steps are finished after various steps (step 83 of FIG. 14), the electric test is executed (step 84 of FIG. 14) and the result is fed back to a junction process to thereby execute the countermeasure (step 87 of FIG. 14). However, according to the conventional method, a time period of one through several months is required after passing through a junction forming step (step 81 of FIG. 14) until feedback is executed (step 87 of FIG. 14) and during the time period, when failure is caused, all of products are failed or fabricated with low yield.

In contrast thereto, according to the inspection method of the invention, inspection of retention failure is executed immediately after forming junction (step 85 of FIG. 14). Based on the result, the result is fed back to the junction forming step immediately therebefore (step 81 of FIG. 14) (step 86 of FIG. 14), thereby, the time period of countermeasure which has required several months conventionally, is shortened to several days and optimization of the junction process can be executed at an early stage. Further, by executing the inspection of the invention periodically in line, a variation in various fabrication condition or occurrence of abnormality can promptly be grasped and therefore, occurrence of a large amount of failures can be prevented beforehand.

Further, it becomes possible to apply the inspection method and the inspection system according to the invention and determine process conditions of fabricating a wafer to be inspected efficiently and accurately in a short period of time, as a result, a further pertinent process can be applied to the fabricating steps and therefore, reliability of a product can be promoted. Further, since inspection by the invention is automated, occurrence of failure can be detected at an early stage and therefore, the productivity of a semiconductor device can be promoted.

As mentioned above, with regard to the constitution of the representative system and the inspection method according to the invention, an explanation has been given of embodiments of specific inspection flow, operation of respective portions, the flow for determining the inspection conditions, further, inspection and an inspection condition setting method, the invention is enabled in an inspection method and an inspection system combined with a plurality of characteristics specified in the scope of claims within a range not deviated from the range of the invention.

By using the inspection method and the inspection system according to the invention, the inspection is made possible with regard to a wafer in the midst of semiconductor fabricating steps. Further, the inspection is made possible immediately after the ion implantation processing for forming junction. When leakage failure is caused, the failure can promptly be detected by the inspection according to the invention. In optimizing the process conditions, the acceptability of the process can promptly be determined. Therefore, the efficiency of the countermeasure is remarkably promoted, as a result, a time period of developing a semiconductor fabrication process and a time period of promoting yield can significantly be shortened.

Further, according to the inspection of the invention, a distribution of leakage failures can be grasped, further, frequencies of occurrence of failures in different retention time periods can be calculated and therefore, characteristics other than the failure level in a certain retention time period can be grasped. Cause of occurrence of failures can easily be calculated from the distribution. Further, by grasping the characteristic of the failure level, the yield of the wafer to be inspected can be predicted.

Owning to these effects, presence or absence or leakage failure caused on a wafer, failure distribution and cause of occurrence of failure can be grasped efficiently, at high speed and with high accuracy. By applying the inspection to the substrate fabricating process, a wafer in the midst of steps which cannot be inspected by the conventional technology, can be inspected at an early stage. The problem can be grasped accurately and promptly and therefore, a countermeasure processing against abnormality can be executed at an early stage in the substrate fabricating process. As a result, the failure rate of a semiconductor device or other substrate can be reduced and the productivity can be promoted.

Further, by applying the inspection, occurrence of failure can be detected swiftly, a countermeasure thereagainst can be executed earlier than that in the conventional technology. A large amount of occurrence of failures can be prevented beforehand. Occurrence of failure per se can be reduced and therefore, reliability of semiconductor device can be promoted, efficiency of developing a new product is promoted and fabrication cost can be reduced.

What is claimed is:

1. An inspection system of a sample on which a pattern is formed, comprising:
   an electron beam optics unit for irradiating a sample with an electron beam, and outputting a signal of detected secondary electrons generated by the irradiation of the electron beam;
   a control unit for controlling an irradiation time period of the electron beam, an irradiation interval time of the electron beam and a location on the sample to which the electron beam is irradiated; and
   an image processing unit that specifies a location of causing retention leakage by analyzing the output signal;
   wherein said image processing unit displays a frequency distribution of a failure occurrence with retention leakage or retention time period.

2. An inspection system of a sample to which a circuit pattern is formed according to claim 1,
   wherein coordinates of said specified location can be outputted by external communication.

3. An inspection system of a sample to which a circuit pattern is formed according to claim 1, wherein said interval time between one irradiation and the next irradiation of the electron beam is shorter than a charge alleviating time of the surface of the sample.

4. An inspection system of a sample to which a circuit pattern is formed according to claim 1,
wherein said image processing unit specifies a location of causing retention leakage by a comparison of the acquired image and a reference image.

5. An inspection system of a sample on which a pattern is formed, comprising:
an electron beam optics unit for irradiating the sample with an electron beam, and outputting a signal of detected secondary electrons generated by the irradiation of the electron beam:
a control unit for controlling an irradiation time period of the electron beam, an irradiation interval time of the electron beam and a location on the sample to which the electron beam is irradiated;
an image processing unit that specifies a location of causing retention leakage by analyzing an output signal of the detector and visualizes a frequency distribution of a failure occurrence with retention leakage or retention time period; and
a graphical user interface unit for displaying the processing result of said image processing unit.

6. An inspection system of a sample on which a circuit pattern is formed, comprising:
an electron beam optics unit for irradiating an electron beam to a sample;
a sample stage for mounting the sample;
a detector for detecting electrons secondarily generated by an irradiation of the electron beam to the sample;
a blanking control unit for controlling a irradiation time period of the electron beam;
a first control unit for controlling an irradiation interval time of the electron beam, a location of a beam spot of the electron beam on the sample and the blanking control unit; and
a second control unit that visualizes and specifies a location of causing retention leakage by analyzing an output signal of the detector and displays a frequency distribution of a failure occurrence with retention leakage or retention time period.

* * * * *

UNITED STATES PATENT AND TRADEMARK OFFICE
CERTIFICATE OF CORRECTION

PATENT NO. : 7,375,538 B2
APPLICATION NO. : 11/166231
DATED : May 20, 2008
INVENTOR(S) : Mari Nozoe et al.

It is certified that error appears in the above-identified patent and that said Letters Patent is hereby corrected as shown below:

Title Page, Item (12) "Nozoe" should read --Nozoe et al.--.

Title Page, Item (75) should read --Inventors: Mari Nozoe, Hino (JP); Mitsuo Suga, Koshigaya (JP); Yoichiro Neo, Kokubunji (JP); Hidetoshi Nishiyama, Kokubunji (JP)--.

Signed and Sealed this
Twenty-fifth Day of September, 2012

David J. Kappos
*Director of the United States Patent and Trademark Office*